United States Patent
Kaneko et al.

[11] Patent Number: 5,936,394
[45] Date of Patent: Aug. 10, 1999

[54] METHOD AND APPARATUS FOR MEASURING CRITICAL CURRENT VALUE OF SUPERCONDUCTING WIRE

[75] Inventors: Tetsuyuki Kaneko; Tetsuaki Sashida, both of Osaka, Japan

[73] Assignee: Sumitomo Electric Industries, Ltd., Osaka, Japan

[21] Appl. No.: 09/028,929

[22] Filed: Feb. 24, 1998

[30] Foreign Application Priority Data

Feb. 25, 1997 [JP] Japan .................................. 9-040887

[51] Int. Cl.⁶ .......................... G01N 27/00; G01R 19/00
[52] U.S. Cl. .......................... 324/72; 324/71.6; 505/843
[58] Field of Search ...................................... 324/691, 713,
324/715, 71.6, 72, 76.11; 361/141, 19;
505/160, 230, 726, 843; 29/599

[56] References Cited

U.S. PATENT DOCUMENTS

| | | | |
|---|---|---|---|
| 4,996,472 | 2/1991 | Mallick, Jr. .............................. | 324/71.6 |
| 5,065,087 | 11/1991 | Kita et al. ................................ | 324/71.6 |
| 5,134,360 | 7/1992 | Martin et al. ............................ | 324/71.6 |
| 5,223,798 | 6/1993 | McGinnis et al. ....................... | 505/843 |
| 5,339,025 | 8/1994 | Jones et al. .............................. | 324/71.6 |

FOREIGN PATENT DOCUMENTS 10-197468  7/1998  Japan .

*Primary Examiner*—Diep N. Do
*Attorney, Agent, or Firm*—McDermott, Will & Emery

[57] ABSTRACT

Method and apparatus of measuring a critical current value of a superconducting wire formed by wire sections S(n), n being $1 \leq n \leq N$ and initially set to 1, comprising a first step (a) of determining electric currents I(m), m being $1 \leq m \leq M$; a second step (b) of setting m to 1; a third step (c) of passing the electric current I(m) through the wire section S(n); a fourth step (d) of detecting a voltage generated in the wire section S(n) by the electric current I(m); a fifth step (e) of replacing m with m+1; a sixth step (f) of repeating the steps (c) to (e) until m is equal to M; a seventh step (g) of replacing n with n+1; an eighth step (h) of repeating the steps (b)–(g) until n is equal to N, thereby obtaining N×M voltages; a ninth step (i) of setting m to 1; a tenth step (j) of summing up the N voltages generated by the same electric current I(m) to obtain a summation voltage represented by Vsum(m); an eleventh step (k) of replacing m with m+1 after the step (j); a twelfth step (l) of repeating the steps (j) and (k) until m is equal to M, thereby obtaining M summation voltages Vsum(m); and a thirteenth step (m) of calculating the critical current value of the superconducting wire on the basis of a reference voltage and a relationship between the summation voltages Vsum(m) and the electric currents I(m), the reference voltage being predetermined depending upon the superconducting wire length.

17 Claims, 7 Drawing Sheets

METHOD AND APPARATUS FOR MEASURING CRITICAL CURRENT VALUE OF SUPERCONDUCTING WIRE

BACKGROUND OF THE INVENTION

1. Field of the Invention

The present invention relates to method and apparatus for measuring a total critical current value of a superconducting wire or local critical current values of the superconducting wire. Especially, the method and apparatus are suitable for the measurement of a superconducting wire having a great length larger than 100 m.

2. Description of the Related Art

Generally, the critical current value of the superconducting wire is measured by obtaining a current-voltage characteristic of the superconducting wire, i.e., a relationship between electric currents applied to the superconducting wire and voltages respectively generated by the electric currents in the superconducting wire. As a method of measuring the critical current value of the superconducting wire having a great length, the following two measuring methods are well known and used. One of the measuring methods comprises a first step of selecting a certain wire section which partially forms the superconducting wire and has a short length, a second step of measuring a critical current value of the selected wire section. The critical current value of the selected wire section is regarded as a total critical current value of the superconducting wire.

The other one of the well-known measuring methods comprises a first step of cutting off a wire segment from the superconducting wire, a second step of transforming the wire segment in the shape of a coil, and a third step of putting the coiled wire segment in a cooling bath. The cooling bath contains for example liquid nitrogen. The other one of measuring methods further comprises a fourth step of attaching, the coiled wire segment, a pair of electrodes for applying an electric current to the coiled wire segment and another pair of electrodes for picking up a voltage generated in the coiled wire segment, and a fifth step of varying the electric current applied to the coiled wire segment. The method further comprises a sixth step of detecting voltages respectively generated by the different electric currents in the coiled wire segment, and a seventh of obtaining a relationship between the electric currents applied to the coiled wire segment and the voltages generated in the coiled wire segment. The measuring method further comprises an eighth step of calculating a critical current value of the wire segment on the basis of the relationship between the applied electric currents and the generated voltages. Similarly to the former measuring method, the critical current value of the wire segment may be regarded as a total critical current value of the superconducting wire.

The foregoing measuring methods, however, have drawbacks described below. In the former and latter methods, the critical current value of the selected wire section or the coiled wire segment does not always correspond to the total electric current value of the superconducting wire because of the fact that the critical current value is not constant throughout the whole superconducting wire. Through such measuring methods, cannot be obtained an accurate critical current value of the whole superconducting wire.

In the latter measuring method, there occurs a magnetic field when the electric current is applied to the coiled wire segment. The magnetic field affects the critical current value and, for the reason, an accurate critical current value cannot be obtained. If the superconducting wire is continuously produced by a manufacturing apparatus, the cutting operation required in the latter method causes the productivity of the superconducting wire to be reduced. If, furthermore, the wire segment is treated as a product, the wire segment cannot be further cut into pieces. In this case, as the required length of the wire segment becomes larger, the coiled wire segment becomes larger. Therefore, there are a probability that the coiled wire segment cannot be put into the cooling bath and, accordingly, that the critical current value cannot be measured.

SUMMARY OF THE INVENTION

It is an object of the present invention to provide method and apparatus for accurately measuring a total critical current value of a great length superconducting wire without the necessity of cutting or coiling the superconducting wire.

It is another object of the present invention to provide method and apparatus for accurately measuring local critical current values of a great length superconducting wire to detect the variation of the critical current value in an axial direction of the superconducting wire without the necessity of cutting or coiling the superconducting wire.

In accordance with one aspect of the present invention, there is provided a method of measuring a critical current value of a superconducting wire divided into a plurality of wire sections longitudinally aligned. Each of the wire sections is represented by S(n), n being $1 \leq n \leq N$, N being an integer larger than 1, and n being initially set to 1. The measuring method comprises the steps of:

(a) determining a plurality of electric currents different from one another, each of the electric currents being represented by I(m), m being $1 \leq m \leq M$, and M being an integer larger than 1;

(b) setting m to 1;

(c) passing the electric current I(m) through the wire section S(n) of the superconducting wire;

(d) detecting a voltage generated in the wire section S(n) by the electric current I(m);

(e) replacing m with m+1 after the step (d)

(f) repeating the steps (c) to (e) until m is equal to M;

(g) replacing n with n+1 after the step (f)

(h) repeating the steps (b)–(g) until n is equal to N, thereby obtaining N×M voltages;

(i) setting m to 1 after the step (h);

(j) summing up the N voltages generated by the same electric current I(m) to obtain a summation voltage represented by Vsum(m);

(k) replacing m with m+1 after the step (j);

(l) repeating the steps (j) and (k) until m is equal to M, thereby obtaining M summation voltages Vsum(m); and (m) calculating the critical current value of the superconducting wire on the basis of a reference voltage and a relationship between the summation voltages Vsum(m) and the electric currents I(m), the reference voltage being predetermined depending upon the length of the superconducting wire.

According to the above-mentioned measuring method, by passing through the steps (b) to (h), is obtained a relationship between the applied electric currents and the generated voltages in every wire section. This means that a current-voltage characteristic throughout the whole superconducting wire is obtained. Since the critical current value of the superconducting wire is calculated on the basis of the current-voltage characteristic throughout the whole superconducting wire by passing through the steps (i) to (m), the calculated critical current value can be recognized to be just representative of the whole superconducting wire. In addition, since the length of the wire section can become considerably small to such an extent that the wire section is put into a cooling bath without the necessity of transforming the wire section in the shape of a coil, there occurs scarcely a magnetic field during the detection of the voltages. For this reason, the critical current value can be accurately measured. The present measuring method is suitable for a great length superconducting wire because of the fact that the length of the superconducting wire is unlimited in the method. The present measuring method comprises no step of cutting the superconducting wire, so that the number of measuring steps can be reduced. If, therefore, the present measuring method is adopted in the measurement of a superconducting wire continuously produced by a manufacturing apparatus, the adoption of the present measuring method can prevent the productivity of the superconducting wire from being reduced.

The step (m) may comprise a step (m1) of drawing a characteristic curve representative of the relationship between the summation voltages and the electric currents in a current-voltage coordinate system, and a step (m2) of obtaining, as the critical current value, an electric current defining a point on the curve in cooperation with the reference voltage. In the step (m) thus comprised, even if the reference voltage is between adjoining two summation voltages, the critical current value can be accurately measured.

Alternatively, the step (m) may comprise a step (m1) of selecting, from among the summation voltages, adjoining two summation voltages between which the reference voltage intervenes, a step (m2) of drawing, in a current-voltage coordinate system, a rectilinear segment connecting two points which are respectively defined by the selected two summation voltages and two electric currents causing the selected two summation voltages, and a step (m3) of obtaining, as the critical current value, an electric current defining a point on the rectilinear segment in cooperation with the reference voltage. Similarly to the former modification of the step (m), the critical current value of the superconducting wire can be accurately measured even if the reference voltage is between adjoining two summation voltages.

In accordance with another aspect of the present invention, there is provided a method of measuring local critical current values of a superconducting wire divided into a plurality of wire sections longitudinally aligned. Each of the local critical current values is indicative of a critical current value of each of the wire sections of the superconducting wire, each of the wire sections being represented by $S(-n)$, n being $1 \leq n \leq N$, N being an integer larger than 1, and n being initially set to 1. The measuring method comprises the steps of;

(a) determining a plurality of electric currents different from one another, each of the electric currents being represented by $I(m)$, m being $1 \leq m \leq M$, and M being an integer larger than 1;

(b) setting m to 1;

(c) passing the electric current $I(m)$ through the wire section $S(n)$ of the superconducting wire;

(d) detecting a voltage generated in the wire section $S(n)$ by the electric current $I(m)$;

(e) replacing m with m+1 after the step (d);

(f) repeating the steps (c) to (e) until m is equal to M;

(g) replacing n with n+1 after the step (f);

(h) repeating the steps (b)–(g) until n is equal to N, thereby obtaining N×M voltages represented by $V(n, m)$;

(i) setting n to 1 after the step (h);

(j) calculating the local critical current value on the basis of a reference voltage and a relationship between the voltages $V(n,1)$ to $V(n,M)$ in the wire section $S(n)$ and the electric currents $I(1)$ to $I(M)$, the reference voltage being predetermined depending upon the length of the wire section $S(n)$;

(k) replacing n with n+1 after the step (j);

(l) repeating the steps (j) and (k) until n is equal to N, thereby obtaining all the local critical current values of the superconducting wire.

According to the measuring method of the another aspect, by passing through the steps (b)–(1), are obtained current-voltage characteristics of all the wire sections. Based on the current-voltage characteristics, are respectively calculated all the local critical current values of the superconducting wire, i.e., the critical current values of all the wire sections. Since the local critical current values are directly measured, the measured local critical current values are extremely accurate. The variation of the critical current value throughout the whole superconducting wire can be accurately sensed from the local critical current values. Furthermore, since the length of the wire section can become considerably small to such an extent that the wire section is put into a cooling bath without the necessity of transforming the wire section in the shape of a coil, there occurs scarcely a magnetic field during the detection of the voltages. For this reason, the local critical current values can be accurately measured.

The step (j) may comprise a step (j1) of drawing a characteristic curve representative of the relationship between the voltages and the electric currents of the wire section $S(n)$ in a current-voltage coordinate system, and a step (j2) of obtaining, as the local critical current value, an electric current defining a point on the curve in cooperation with the reference voltage. In the step (J) thus comprised, even if the reference voltage is between adjoining two detected voltages, the local critical current value can be accurately measured.

Alternatively, the step (j) may comprise a step (j1) of selecting, from among the voltages, adjoining two voltages between which the reference voltage intervenes, a step (j2) of drawing, in a current-voltage coordinate system, a rectilinear segment connecting two points which are respectively defined by the selected two voltages and two electric currents causing the selected two voltages, and a step (j3) of obtaining, as the local critical current value, an electric current defining a point on the rectilinear segment in cooperation with the reference voltage. Similarly to the former modification of the calculating step (j), the local critical current values can be accurately measure even if the reference voltage is between adjoining two detected voltages.

In accordance with a further aspect of the present invention, there is provided an apparatus for measuring a critical current value of a superconducting wire. The superconducting wire is divided into a plurality of wire sections longitudinally aligned. The measuring apparatus comprises conveying means for conveying the superconducting wire from a first location to a second location, cooling means for cooling one of the wire sections positioned between the first location and the second location, current applying means for applying an electric current to the wire section cooled by the cooling means, current varying means for varying the electric current applied by the current applying means, thereby applying different electric currents to the wire section, voltage detecting means for detecting voltages each generated in the wire section by the electric current each time the electric current is varied by the current varying means, and calculating means for calculating the critical current value on the basis of the electric currents applied to the wire section and the voltages detected by the voltage detecting means.

The measuring apparatus thus constructed can perform either of the aforesaid measuring methods. If, therefore, the former measuring method is performed by the measuring apparatus, the critical current value of the whole superconducting wire can be accurately measured. In addition, since the length of the wire section can become considerably small to such an extent that the wire section is put into a cooling bath without the necessity of transforming the wire section in the shape of a coil, there occurs scarcely a magnetic field during the detection of the voltages. For this reason, the critical current value can be more accurately measured. The present measuring apparatus is suitable for the measurement of a great length superconducting wire because of the fact that the length of the superconducting wire is unlimited in the method. The measuring apparatus comprises no means for cutting the superconducting wire, so that the number of measuring process can be reduced. If, therefore, the present measuring apparatus is adopted in the measurement of a superconducting wire continuously produced by a manufacturing apparatus, the adoption of the present measuring apparatus can prevent the productivity of the superconducting wire from being reduced. If the latter measuring method is performed by the measuring apparatus, the variation of the critical current value in an axial direction of the superconducting wire can be accurately sensed from the local critical current values. Since the length of the wire section can become considerably small to such an extent that the wire section is put into a cooling bath without the necessity of transforming the wire section in the shape of a coil, there occurs scarcely a magnetic field during the detection of the voltages. As a consequence, the local critical current values can be accurately measured.

The current applying means may comprise a current source for generating the electric current, and a pair of electrodes connected to the current source and detachably attached to the superconducting wire for passing the electric current throughout the wire section cooled by the cooling means. If the current applying means is thus constructed, the electrodes of the current applying means can be detached from the superconducting wire during the conveyance of the superconducting wire. As a result, the superconducting wire can be smoothly conveyed with facility.

Each of the electrodes of the current applying means may include a pair of electrode pieces facing to each other and allowing the superconducting wire to be sandwiched therebetween. Furthermore, the current applying means further may comprise a pair of support members each movably supporting one of the electrode pieces of each electrode, a pair of elastic members each intervening between each support member and the one of the electrode pieces of each electrode, and movement means for moving the support members to press the one of the electrode pieces of each pair of electrodes on the other of the electrode pieces of each pair of electrodes and release the one of the electrode pieces of each pair of electrodes from the other of the electrode pieces of each pair of electrodes. If the current applying means is thus constructed, the electrode pieces of the current applying means can be brought into contact with the superconducting wire with a soft touch. This results in the fact that the superconducting wire can be prevented from being damaged by the electrode pieces of the current applying means.

The electrodes of the current applying means may be made of noble metal such as gold or silver. Since the noble metal is resistance to oxidation, the electrical contact between each electrode and the superconducting wire can be hold in a preferable condition for a long time.

Each of the electrodes of the current applying means may be in the shape of a roller, the electrodes of the current applying means being rotated as the superconducting wire is conveyed by the conveying means. If the electrodes of the current applying means are thus constructed, the superconducting wire can be prevented from being rubbed with and accordingly Damaged by the electrodes of the current applying means. Furthermore, the electrodes of the current applying means is brought into contact with the superconducting wire in large area, so that the electrical contact between each electrode and the superconducting wire can be held in preferable condition, thereby making it possible to enhance the reliability of the electrical contact.

The voltage detecting means may comprise a pair of electrodes, one of the electrodes being detachably attached to one end of the wire section cooled by the cooling means, and the other of the electrodes being detachably attached to the other end of the wire section cooled by the cooling means, and a voltmeter connected to the electrodes for picking up the voltage generated in the wire section. If the voltage detecting means is thus constructed, the electrodes of the voltage detecting means can be detached from the superconducting wire during the conveyance of the superconducting wire. As a result, the superconducting wire can be smoothly conveyed with ease.

Each of the electrodes of the voltage detecting means may include a pair of electrode pieces facing to each other and allowing the superconducting wire to be sandwiched therebetween. In addition, the voltage detecting means may further comprise a pair of support members each movably supporting one of the electrode pieces of each electrode, a pair of elastic members each intervening between each support member and the one of the electrode pieces of each electrode, and movement means for moving the support members to press the one of the electrode pieces of each pair of electrodes on the other of the electrode pieces of each pair of electrodes and release the one of the electrode pieces of each pair of electrodes from the other of the electrode pieces of each pair of electrodes. If the voltage detecting means is thus constructed, the electrode pieces of the voltage detecting means can be brought into contact with the superconducting wire with a soft touch. That results in the fact that the superconducting wire can be prevented from being damaged by the electrode pieces of the voltage detecting means.

The electrodes of the voltage detecting means may be made of noble metal such as gold or silver. Since the noble metal is resistance to oxidation, the electrical contact between each electrode and the superconducting wire can be hold in a preferable condition for a long time.

Each of the electrodes of the voltage detecting means may be in the shape of a roller. The electrodes of the voltage detecting means may be rotated as the superconducting wire is conveyed by the conveying means. If the electrodes of the voltage detecting means are thus constructed, the superconducting wire can be prevented from being rubbed with and accordingly damaged by the electrodes of the voltage detecting means. Furthermore, the electrodes of the voltage detecting means is brought into contact with the superconducting wire in large area, so that the electrical contact between each electrode and the superconducting wire can be held in preferable condition, thereby making it possible to enhance the reliability of the electrical contact.

The conveying means may apply a tension equal to or smaller than 500 g/mm$^2$ to the superconducting wire during conveying the superconducting wire. If the conveying means is thus constructed, the superconducting wire can be prevented from being damaged while the superconducting wire is conveyed by the conveying means.

The conveying means may comprise at least one roller brought into contact with the superconducting wire and changing the advance direction of the superconducting wire, the roller having a diameter equal to or larger than 300 mm. If the conveying means is thus constructed, the superconducting wire is not forced to be bent at a sever curvature. Therefore, the superconducting wire can be prevented from being damaged while the superconducting wire is conveyed by the conveying means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
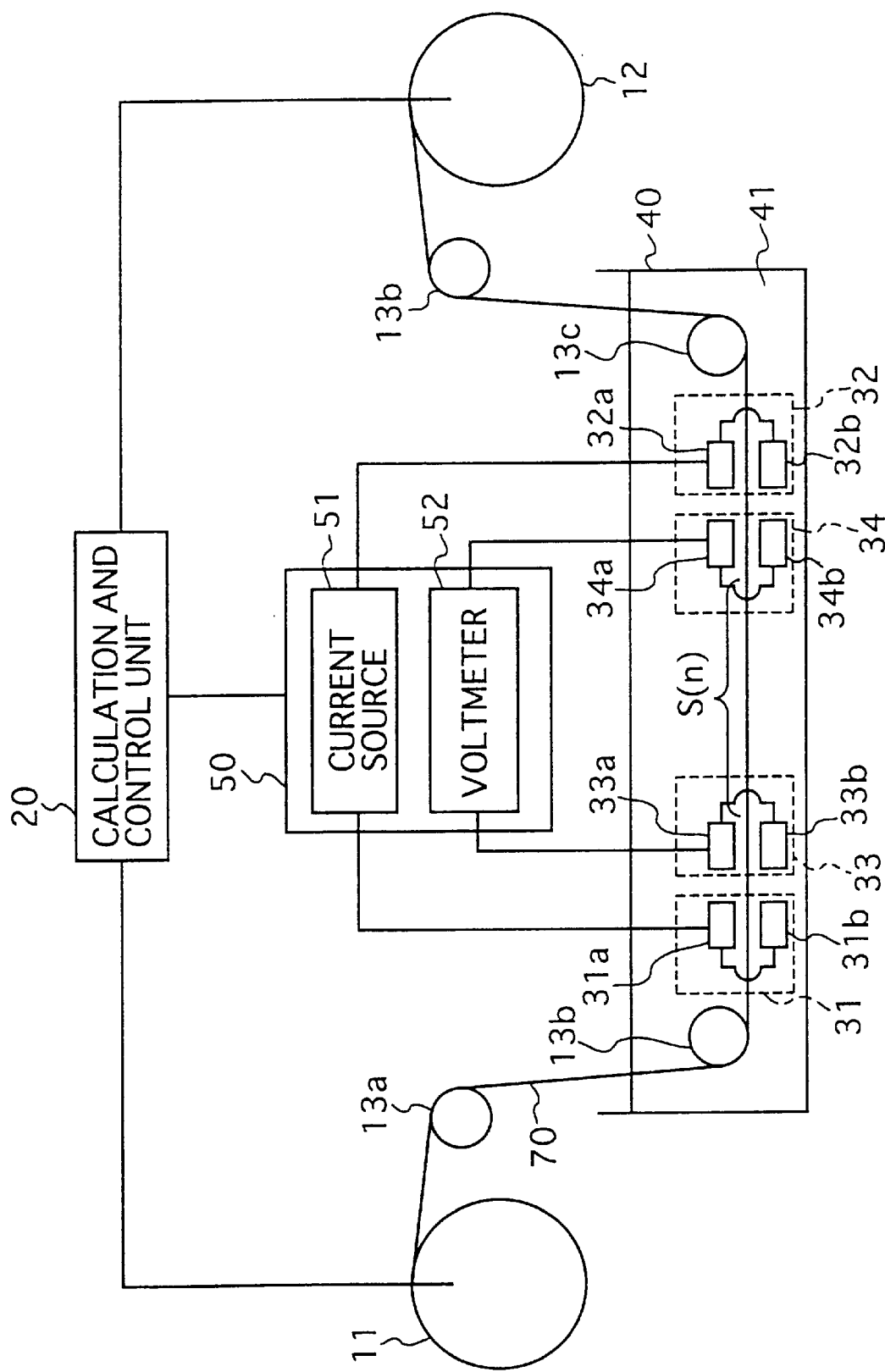
FIG. 1 is a schematic illustration showing a first embodiment of the measuring apparatus according to the present invention.

Referring to FIGS. 1 to 9 of the drawings, a first embodiment of a measuring apparatus according to the present invention will be described hereinlater. The measuring apparatus is shown in FIG. 1 as comprising a feed roller 11, a receive roller 12, carrier rollers 13a, 13b, 13c and 13d, a calculation and control unit 20, a pair of current electrode units 31 and 32, a pair of voltage electrode units 33 and 34, a cooling bath 40 and an electric circuit unit 50.

The feed roller 11 and the receive roller 12 are cylindrical and respectively rotated by electric motors (not shown). Initially, the feed roller 11 has a superconducting wire 70 wound thereon. Initially, one end of the superconducting wire 70 is drawn out of the feed roller 11 and carried to the receive roller 12 by way of the carrier rollers 13a and 13b, the current electrode unit 31, the voltage electrode units 33 and 34, the current electrode unit 32, the carrier rollers 13c and 13d. Then, the one end of the superconducting wire 70 is fastened on the receive roller 12.

The superconducting wire 70 comprises an oxide superconducting material which is sheathed with silver. The oxide superconducting material is not limited to a specific one and may be $(Bi_x—Pb_{2-x})Sr_2Ca_2Cu_3O_{10}$. Preferably, the superconducting wire 70 may have a length larger than 100 m. Although the superconducting wire 70 is not limited to a specific shape in section, the superconducting wire 70 may be preferably in the form of a tape having a width of about 3 mm and a thickness of about 0.2 mm. If the operation of the measuring apparatus is started, the superconducting wire 70 is fed from the feed roller 11 to and wound on the receive roller 12. At least part of the superconducting wire 70 is divided into a plurality of wire sections which are longitudinally aligned. Each of the wire sections is represented by S(n). Note that n is $1 \leq n \leq N$, N is an integer larger than 1. This never means that the superconducting wire 70 is physically cut into pieces. The length of one wire section S(n) corresponds to a distance between the voltage electrode units 33 and 34.

The calculation and control unit 20 is capable of executing various programs to calculate desired values and generate instructions on the basis of input data and comprises, for example, a personal computer or a workstation. The calculation and control unit 20 is electrically connected to the electric circuit unit 50 and the electric motors for the feed roller 11 and the receive roller 12. The feed roller 11 and the receive roller 12 are rotated by the electric motors in accordance with instruction signals generated by the calculation and control unit 20. It is noted that the calculation and control unit 20 can rotate the feed roller 11 and the receive roller 12 in independent relationship to each other. For example, the calculation and control unit 20 can rotate only the feed roller 11 or only the receive roller 12. Therefore, the calculation and control unit 20 can regulate a tension of the superconducting wire between the feed roller 11 and the receive roller 12 by controlling the rotations of the feed roller 11 and the receive roller 12. In addition, the calculation and control unit 20 receives data from the electric circuit unit 50 and calculates desired values, i.e., critical current values on the basis of the received data. The calculation process will become apparent as the description proceeds.

The current electrode unit 31 comprises a pair of electrode pieces 31a and 31b which are respectively three-centimeter cubes made of noble metal such as gold or silver. The electrode pieces 31a and 31b face to each other and allow the superconducting wire 70 to be sandwiched therebetween. Likewise, the current electrode unit 32 comprises a pair of electrode pieces 32a and 32b which are respectively three-centimeter cubes made of noble metal such as gold or silver. The electrode pieces 32a and 32b face to each other and allow the superconducting wire 70 to be sandwiched therebetween.

The voltage electrode units 33 and 34 are located between the current electrode units 31 and 32. Similarly to the current electrode units 31 and 32, the voltage electrode unit 33 comprises a pair of electrode pieces 33a and 33b which are respectively three-centimeter cubes made of noble metal such as gold or silver. The electrode pieces 33a and 33b face to each other and allow the superconducting wire 70 to be sandwiched therebetween. The voltage electrode unit 34 comprises a pair of electrode pieces 34a and 34b which are respectively three-centimeter cubes made of noble metal such as gold or silver. The electrode pieces 34a and 34b face to each other and allow the superconducting wire 70 to be sandwiched therebetween.

Figure 2:
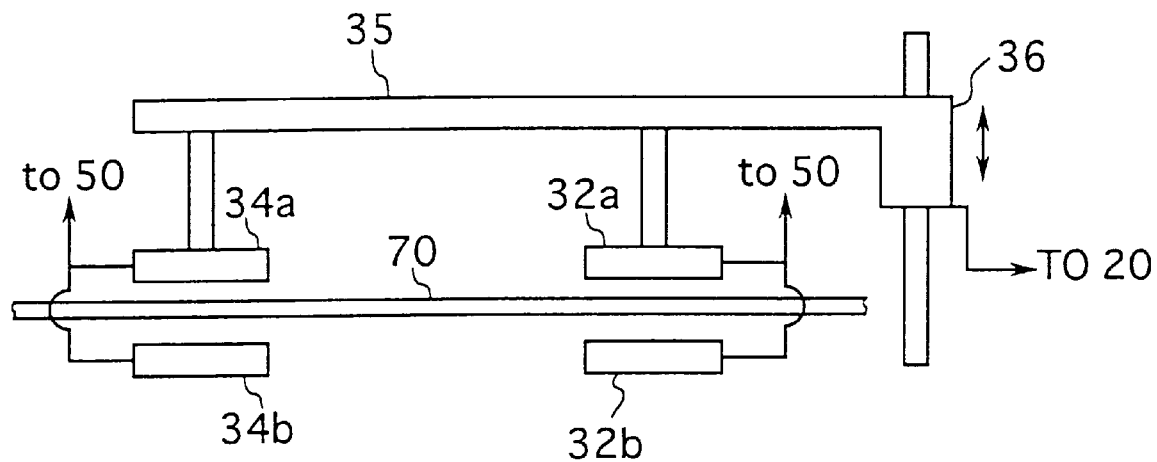
FIG. 2 is a schematic illustration showing one of a pair of current electrode units and one of a pair of voltage electrode units at a time when a superconducting wire is conveyed.
Figure 3:
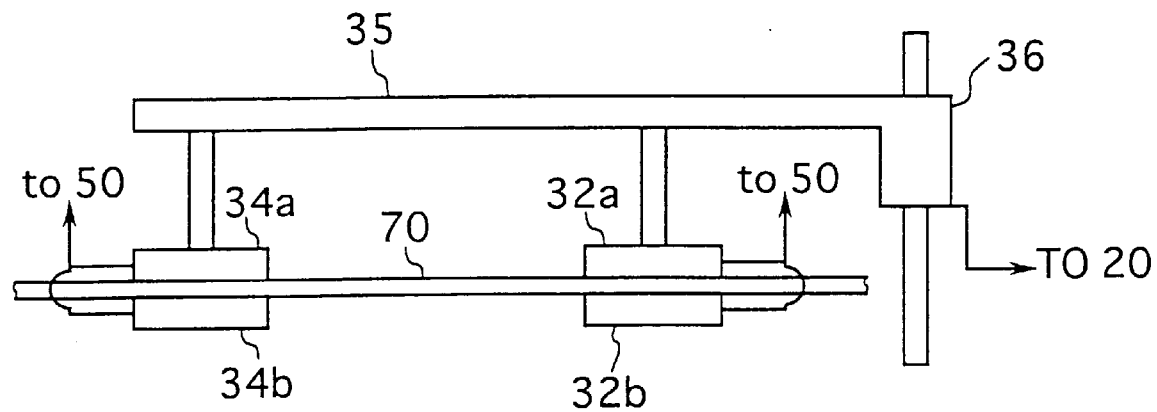
FIG. 3 is a schematic illustration showing one of the current electrode units and one of the voltage electrode units at a time when an electric current is applied to the superconducting wire and when a voltage generated in the superconducting wire is detected.

As shown in FIG. 2, the upper side electrode pieces 32a and 34a of the current and voltage electrode units 32 and 34 are supported by an electrode support member 35 which is moved in an upward direction and a downward direction by an electrode moving unit 36 including an electric motor (not shown). The electric motor of the electrode moving unit 36 is electrically connected to and driven in accordance with instructions from the calculation and control unit 20. The lower side electrode pieces 32b and 34b of the current and voltage electrode units 32 and 34 are fixed to the bottom of the cooling bath 40. When the electrode support member 35 is moved by the electrode moving unit 36 in the downward direction, the upper side electrode pieces 32a and 34a are pressed on the lower side electrode pieces 32b and 34b. At this time, as shown in FIG. 3, the superconducting wire 70 is closely sandwiched by the electrode pieces 32a and 32b and by the electrode pieces 34a and 34b and, accordingly, makes electrical contact with the electrode pieces 32a, 32b, 34a and 34b. When, on the contrary, the electrode support member 35 is moved by the electrode moving unit 36 in the upward direction, the upper side electrode pieces 32a and 34a are separated from the lower side electrode pieces 32b and 34b, respectively. At this time, the superconducting wire 70 is released from the electrode pieces 32a, 32b, 34a and 34b and, accordingly, allowed to move smoothly. The upper side electrode pieces 31a and 33a of the remaining current and voltage electrode units 31 and 33 are supported and moved by an electrode support member and an electrode moving unit which are constructed similarly to the electrode support member 35 and the electrode moving unit 36 shown in FIG. 2. In addition, the lower side electrode pieces 31b and 33b of the current and voltage electrode units 31 and 33 are fixed to the bottom of the cooling bath 40. Therefore, the electrode pieces 31a, 31b, 33a and 33b of the current and voltage electrode units 31 and 33 are operated in the same way as the electrode pieces 32a, 32b, 34a and 34b of the current and voltage electrode units 32 and 34 are done. The electrode pieces 31a, 31b, 32a, 32b, 33a, 33b, 34a and 34b of the current and voltage electrode units 31, 32, 33 and 34 are always sunk into the liquid nitrogen 41 contained in the cooling bath 40 during the measuring process, so that the electrode pieces of the current and voltage electrode units 31 to 34 are held at a constant temperature level. This means that the measuring objective wire section of the superconducting wire is prevented from being increased in temperature by the electrode pieces and accordingly that the measuring time can be reduced.

Figure 4:
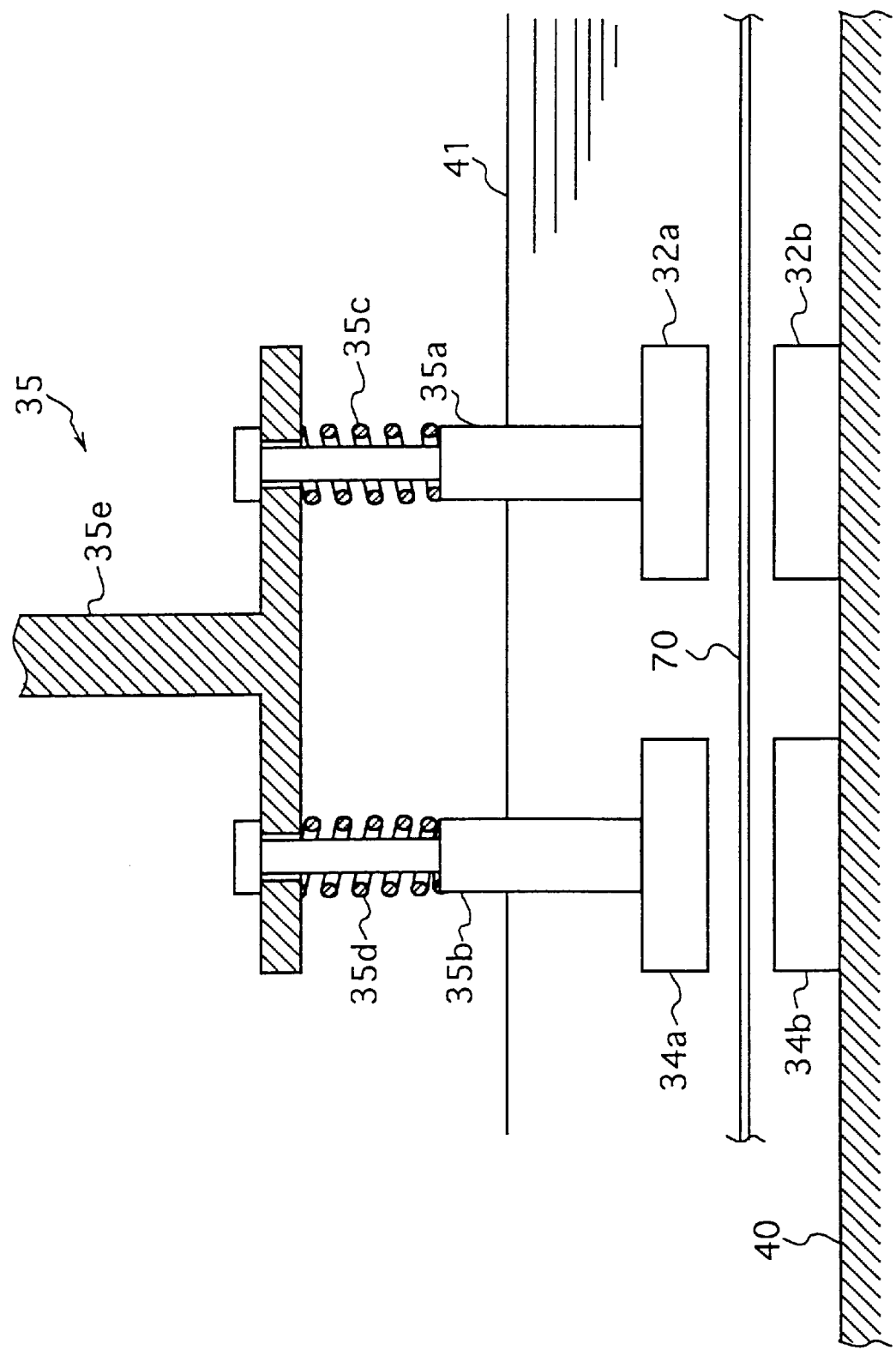
FIG. 4 is a partially sectional view showing a support mechanism for supporting the current electrode unit and the voltage electrode unit.

FIG. 4 minutely shows the support mechanism of the electrode support member 35. The electrode support member 35 is shown in FIG. 4 as comprising connection rods 35a and 35b, coil springs 35c and 35d and a support base member 35e. The connection rod 35a fixedly supports the electrode piece 32a of the current electrode unit 32 and slidably supported by the support base member 35e. The coil spring 35c is interposed between the connection rod 35a and the support base member 35e. Likewise, the connection rod 35b fixedly supports the electrode piece 34a and slidably supported by the support base member 35e. The coil spring 35d is interposed between the connection rod 35b and the support base member 35e. When the support base member 35e is moved downwardly from a position shown in FIG. 4, the electrode pieces 32a, 32b, 34a and 34b are brought into contact with the superconducting wire 70. After the contact, the support press member 35e is further moved downwardly to such an extent that the coil springs 35c and 35d are compressed. At this time, since the coil springs 35c and 35d respectively intervene between the electrode piece 32a and the support base member 35e and between the electrode piece 34a and the support base member 35e, the electrode pieces 32a, 32b, 34a and 34b of the current and voltage electrode units 32 and 34 can be brought and held into contact with the superconducting wire 70 with soft touch. In addition, by setting to an appropriate value the axial lengths of the coil springs 35c and 35d at a time when the coil springs 35c and 35d are compressed, the superconducting wire 70 can be pressed by the electrode pieces 32a and 34a on the electrode pieces 32b and 34b with a desired force. This results in the fact not only that the superconducting wire 70 can be prevented from being damaged by the electrode pieces 31a, 31b, 32a, 32b, 33a, 33b, 34a and 34b but also that the electrical contact between each electrode piece and the superconducting wire 70 can be held in good condition during the current applying and voltage detecting process.

Returning back to FIG. 1 of the drawings, the electric circuit unit 50 comprises a current source 51 and a voltmeter 52. The current source 51 is operated by the calculation and control unit 20 to generate various electric currents and passing them through the wire section S(n) of the superconducting wire 70 by way of the electrode pieces 31a, 31b, 32a and 32b of the current electrode units 31 and 32. Each of the electric currents generated by the current source 51 is represented by I(m). Note that m is $1 \leq m \leq M$, and M is an integer larger than 1. The voltmeter 52 is operated by the calculation and control unit 50 to detect, through the electrode pieces 33a, 33b, 34a and 34b of the voltage electrode unit 33 and 34, voltages which are respectively generated by the electric currents I(m) in the wire section S(n). Assuming that one voltage is generated in the wire section S(n) by the electric current I(m), the voltage is represented by V(n,m). The voltages V(n,m) detected by the voltmeter 52 are received by the calculation and control unit 20. The functions of the calculation and control unit 20 may be performed by the electric circuit unit 50.

<Measuring Example 1>

A first example of the measurement performed by the aforesaid measuring apparatus will be described in detail hereinafter. In the present example, it is assumed that the measuring objective portion of the superconducting wire 70 has a length of 100 m, and that the length of each wire section S(n) is constant and 4 m. Although the total length of the superconducting wire 70 is actually larger than 100 m, the measuring objective portion of the superconducting wire 70 is called a superconducting wire 70 for short. After one end of the superconducting wire 70 is fastened on the receive roller 12, the calculation and control unit 20 instructs the upper side electrode pieces 31a, 32a, 33a and 34a to move in the downward direction, thereby causing the superconducting wire 70 to make electrical contact with the electrode pieces 31a, 31b, 32a, 32b, 33a, 33b, 34a and 34b of the current and voltage electrode units 31, 32, 33 and 34. At the same time, the first wire section S(1) is located between the voltage electrode units 33 and 34. Then, the calculation and control unit 20 instructs the current source 51 to apply an electric current of I(1). At this time, a voltage V(1,1) is generated in the first wire section S(1) of the superconducting wire 70 by the electric current I(1) and detected by the voltmeter 52. The electric circuit unit 50 informs the calculation and control unit 20 of the detected voltage V(1,1). The electric current applied to the first wire section S(1) is stepwise changed to I(2), I(3) . . . and I(100) in described order. In response to the change of the electric current, the voltage detection process by the voltmeter 52 is repeated. As a result, the calculation and control unit 20 obtains V(1,1), V(1,2), V(1,3) . . . and V(1,100) generated by the electric current I(1), I(2), I(3) . . . I(100) in the first wire section S(1). The applied electric currents I(m) and the detected voltages V(1,m) are shown in the following TABLE 1.

detection for the first wire section S(1) is completed, the calculation and control unit 20 instructs the upper side electrode pieces 31a, 32a, 33a and 34a to move in the upwardly direction, thereby releasing the superconducting wire 70 from the current electrode units 31 and 32 and the voltage electrode units 33 and 34. Then, the calculation and control unit 20 instructs the feed roller 11 and the receive roller 12 to rotate, so that superconducting wire 70 is carried by 4 m from the feed roller 11 toward the receive roller 12. This results in the fact that the second wire section S(2) of the superconducting wire 70 is located between the voltage electrode units 33 and 34 and becomes a measurement object. After the conveyance of the superconducting wire 70 is finished, the measuring apparatus operates in the same manner as the foregoing manner to measure the first wire section S(1) of the superconducting wire 70. As a consequence, the calculation and control unit 20 obtains the voltages V(2,1), V(2,2), V(2,3) . . . V(2,100) generated in the second wire section S(2) by the electric current I(1), I(2), I(3) . . . and I(100) and, accordingly, a relationship between the applied electric currents I(m) and the detected voltages V(2,m), i.e., a current-voltage characteristic of the second wire section S(2). In the same way, the calculation and

TABLE 1

| CURRENT (A) | VOLTAGE (mV) | CURRENT (A) | VOLTAGE (mV) | CURRENT (A) | VOLTAGE (mV) |
|---|---|---|---|---|---|
| 0.50 | 0.0010 | 17.50 | 0.0670 | 34.50 | 0.2242 |
| 1.00 | 0.0010 | 18.00 | 0.0697 | 35.00 | 0.2326 |
| 1.50 | 0.0010 | 18.50 | 0.0735 | 35.50 | 0.2389 |
| 2.00 | 0.0010 | 19.00 | 0.0787 | 36.00 | 0.2441 |
| 2.50 | 0.0010 | 19.50 | 0.0823 | 36.50 | 0.2502 |
| 3.00 | 0.0010 | 20.00 | 0.0853 | 37.00 | 0.2604 |
| 3.50 | 0.0012 | 20.50 | 0.0890 | 37.50 | 0.2668 |
| 4.00 | 0.0010 | 21.00 | 0.0944 | 38.00 | 0.2742 |
| 4.50 | 0.0015 | 21.50 | 0.0982 | 38.50 | 0.2819 |
| 5.00 | 0.0024 | 22.00 | 0.1017 | 39.00 | 0.2952 |
| 5.50 | 0.0029 | 22.50 | 0.1051 | 39.50 | 0.3048 |
| 6.00 | 0.0040 | 23.00 | 0.1111 | 40.00 | 0.3149 |
| 6.50 | 0.0039 | 23.50 | 0.1145 | 40.50 | 0.3270 |
| 7.00 | 0.0073 | 24.00 | 0.1184 | 41.00 | 0.3476 |
| 7.50 | 0.0092 | 24.50 | 0.1220 | 41.50 | 0.3641 |
| 8.00 | 0.0109 | 25.00 | 0.1278 | 42.00 | 0.3827 |
| 8.50 | 0.0122 | 25.50 | 0.1324 | 42.50 | 0.4037 |
| 9.00 | 0.0152 | 26.00 | 0.1360 | 43.00 | 0.4417 |
| 9.50 | 0.0173 | 26.50 | 0.1405 | 43.50 | 0.4720 |
| 10.00 | 0.0193 | 27.00 | 0.1467 | 44.00 | 0.5027 |
| 10.50 | 0.0213 | 27.50 | 0.1511 | 44.50 | 0.5475 |
| 11.00 | 0.0250 | 28.00 | 0.1550 | 45.00 | 0.6207 |
| 11.50 | 0.0278 | 28.50 | 0.1596 | 45.50 | 0.6792 |
| 12.00 | 0.0298 | 29.00 | 0.1633 | 46.00 | 0.7468 |
| 12.50 | 0.0325 | 29.50 | 0.1705 | 46.50 | 0.8253 |
| 13.00 | 0.0362 | 30.00 | 0.1753 | 47.00 | 0.9663 |
| 13.50 | 0.0396 | 30.50 | 0.1795 | 47.50 | 1.0709 |
| 14.00 | 0.0424 | 31.00 | 0.1868 | 48.00 | 1.1966 |
| 14.50 | 0.0454 | 31.50 | 0.1916 | 48.50 | 1.3402 |
| 15.00 | 0.0496 | 32.00 | 0.1967 | 49.00 | 1.5946 |
| 15.50 | 0.0525 | 32.50 | 0.2012 | 49.50 | 1.7929 |
| 16.00 | 0.0558 | 33.00 | 0.2090 | 50.00 | 2.0137 |
| 16.50 | 0.0588 | 33.50 | 0.2138 | — | — |
| 17.00 | 0.0636 | 34.00 | 0.2197 | — | — |

Figure 5:
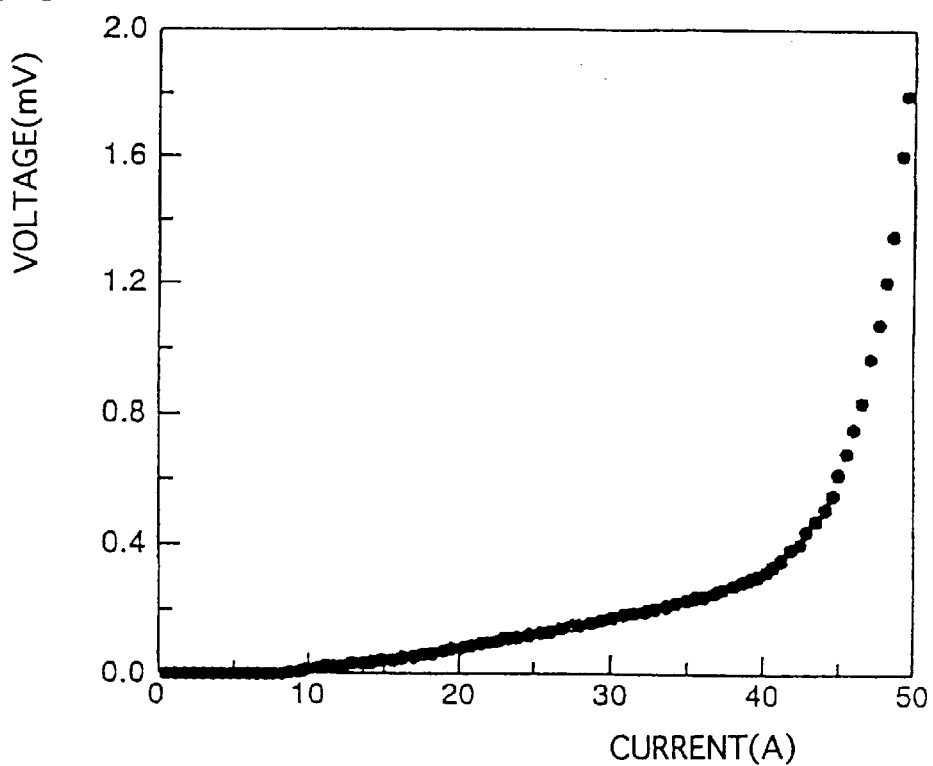
FIG. 5 is a graphical representation showing a relationship between the applied electric currents and the detected voltages in a first wire section of the superconducting wire having a length of 100 m.

FIG. 5 shows a relationship between the applied electric currents I(m) and the detected voltages V(1,m), i.e., a current-voltage characteristic of the first wire section S(1). As well shown in the TABLE 1 and FIG. 5, when the applied electric current I(m) exceeds 40 A, the detection voltage V(1,m) is increased at a great rate. This means that the electric resistance of the first wire section S(1) of the superconducting wire 70 is increased at a great rate when the applied electric current I(m) exceeds 40 A. After the voltage control unit 20 obtains relationships between the electric currents I(1) to I(100) and the voltages V(3,1) to V(3,100) in the third wire section S(3), between the electric currents I(1) to I(100) and the voltages V(4,1) to V(4,100) in the fourth wire section S(4) . . . and between the electric currents I(1) to I(100) and the voltages V(25,1) to V(25,100) in the last wire section S(25) of the superconducting wire 70.

Figure 6:
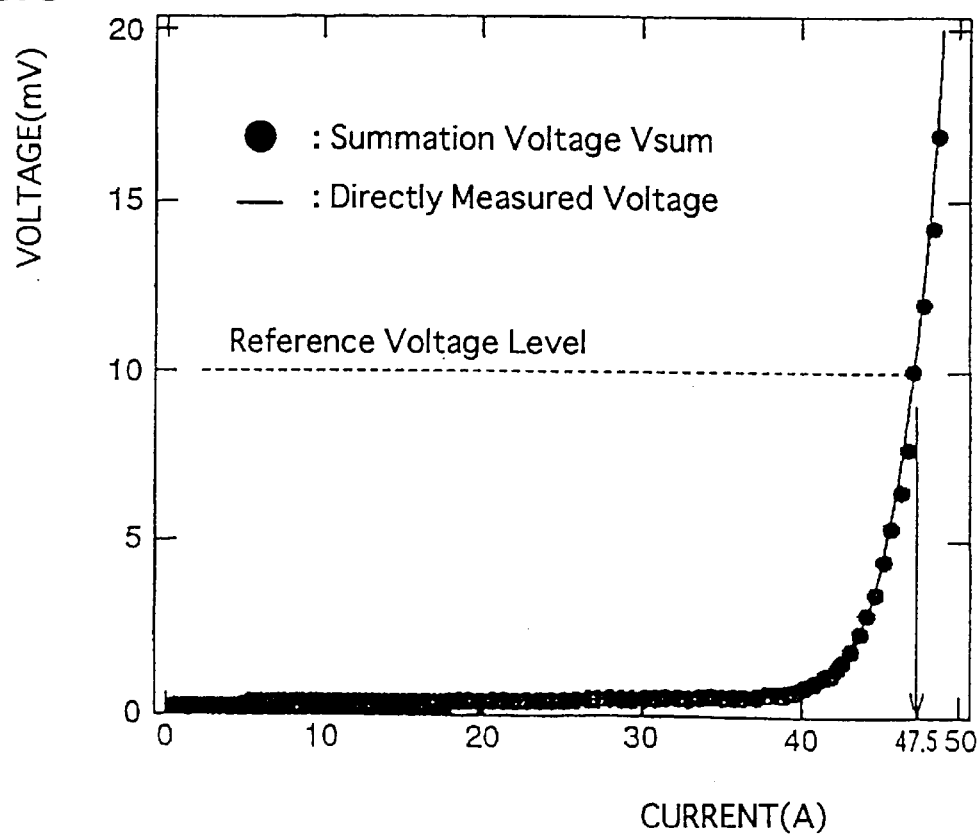
FIG. 6 is a graphical representation showing a relationship between the applied electric currents and the detected voltages in the whole superconducting wire having a length of 100 m.

After obtaining the last relationship between the electric currents and the voltages, the calculation and control unit 20 is operated to calculate summation voltages Vsum(m), the summation voltage Vsum(1) being indicative of a sum of the detected voltages V(1,1), V(2,1) . . . and V(25,1) due to the applied electric current I(1), Vsum(2) being indicative of a sum of the detected voltages V(1,2), V(2,2) . . . and V(25,2) due to the applied electric current I(2) . . . , and Vsum(100) being indicative of a sum of the detected voltages V(1,100), V(2,100) due to the applied electric current I(100). The calculation of the summation voltages Vsum(m) is made in accordance with equations described as follows:

$$Vsum(1) = V(1, 1) + V(2, 1) \ldots + V(N, 1)$$

$$Vsum(2) = V(1, 2) + V(2, 2) \ldots + V(N, 2)$$

$$\vdots$$

$$Vsum(M) = V(1, M) + V(2, M) \ldots + V(N, M)$$

wherein N=25 and M=100. FIG. 6 shows a relationship between the applied electric currents I(1), I(2) . . . and I(100), and the summation voltages Vsum(1), Vsum(2) . . . and Vsum(100), i.e., a current-voltage characteristic indicative of the whole measuring objective portion of the superconducting wire 70 corresponding to a train of all the wire sections S(1) to S(25). In the coordinate system shown in FIG. 6, the electric current I(m) and the summation voltages Vsum(m) collectively define 100 points by "•". As will be understood from the relationship shown in FIG. 6, when the electric current I(m) exceeds 40 A, the summation voltage Vsum(m) is increased at a great rate. This means that the electric resistance of the total measurement objective portion of the superconducting wire 70 is increased at a great rate when the applied electric current I(m) exceeds 40 A.

FIG. 6 also shows a solid line graph which represents another relationship between the electric currents and the generated voltages, obtained through a different method than the foregoing measuring method. The different method is a method of directly detecting voltages throughout the whole superconducting wire and comprises a first step of preparing an uncoiled superconducting wire having a length of 100 meters, a second step of passing an electric current throughout the uncoiled superconducting wire, a third step of varying the electric current, a fourth step of measuring voltages generated between one end and the other end of the uncoiled superconducting wire while the electric current is varied. When the another relationship between the electric currents and the voltages shown by the solid line in FIG. 6 is compared with the relationship obtained through the present method and shown by "•" in FIG. 6, both of the measuring results are considered to be substantially equal to each other. This means that an accurate critical current value of the superconducting wire 70 can be calculated from the present measuring result.

If a reference voltage for a superconducting wire having a length of 1 centimeter is assumed to be 1 $\mu$V, the reference voltage of the superconducting wire having a length of 100 meters is 10 mV. From the reference voltage of 10 mV with reference to FIG. 6, is calculated a critical current value of 47.5 A. More specifically, using the following calculation method, the calculation control unit 20 calculates the critical current value. The calculation method comprises a first step of drawing a characteristic curve representative of a relation between the summation voltages in the current-voltage coordinate system shown in FIG. 6, and a second step of obtaining, as the critical current value, an electric current defining a point on the curve in cooperation with the reference voltage of 10 mV. Instead of the calculation method, may be used another calculation method which comprises a first step of selecting, from among the obtained summation voltages, adjoining two summation voltages between which the reference voltage intervenes, and a second step of drawing, in a current-voltage coordinate system, a rectilinear segment connecting two points which are respectively defined by the selected two summation voltages and two electric currents causing the selected two summation voltages. The another calculation method further comprises a third step of obtaining, as the critical current value, an electric current defining a point on the rectilinear segment in cooperation with the reference voltage.

Based on the current-voltage characteristic shown by the solid line in FIG. 6 and obtained through the method of directly detecting voltages throughout the whole superconducting wire, is calculated a critical current value of 47.3 A. Since, as described hereinbefore, the critical current value obtained in the present embodiment is 47.5 A and accordingly nearly equal to 47.3 A, the critical current value measured through the present method can be considered to be an accurate value.

In the aforesaid description, it is explained that the electrode pieces 31a, 31b, 32a, 32b, 33a, 33b, 34a and 34b are made of noble metal such as gold or silver. In order to confirm that gold or silver is suitable for the electrode pieces 31a, 31b, 32a, 32b, 33a, 33b, 34a and 34b, several experiments were made with adopting various metals as the electrode pieces. The results of the experiments are shown in the following TABLE 2.

TABLE 2

| Kind of Metal | Possible wire length for Measurement |
|---|---|
| Gold | 1000 m |
| Silver | 1000 m |
| Copper | 200 m |
| Stainless Steel | 500 m |

When the electrode pieces are made of gold or silver, the measuring apparatus was able to continuously measure the superconducting wire of 1000 m. When the electrode pieces are made of copper, the measuring apparatus was unable to measure the superconducting wire having a length larger than 200 m. When the electrode pieces are made of stainless steel, the measuring apparatus was unable to measure the superconducting wire having a length larger than 500 m. From the results of the experiments, copper and stainless steel are inferior to gold and silver in serving as materials of the electrode pieces. That is because copper or stainless steel is easily oxidized and, as a result, the electrical contact between each electrode piece and the superconducting wire is apt to decrease in quality. It follows from the results of the experiments shown in TABLE 2 that gold or silver may be most preferably suitable for the electrode pieces 31a, 31b, 32a, 32b, 33a, 33b, 34a and 34b of the current and voltage electrode units 31, 32, 33 and 34.

The aforesaid explanation shows that the tension of the superconducting wire 70 may be equal to or smaller than 500 g/mm$^2$. In order to confirm that the tension equal to or smaller than 500 g/mm is suitable for the superconducting wire in the present measuring apparatus, several experiments were made with applying different tensions to the superconducting wire. The results of the experiments are shown in the following TABLE 3.

TABLE 3

| Tension (g/mm$^2$) | Variation of Critical Current Value (Assume that (Critical Current value) = 1 when Tension = 0 g/mm$^2$) |
|---|---|
| 0 | 1 |
| 200 | 1 |
| 300 | 1 |
| 400 | 1 |
| 500 | 1 |
| 600 | 0.9 |
| 700 | 0.8 |
| 1000 | 0.7 |

As will be understood from TABLE 3, when the tension exceeds 500 g/mm$^2$, the critical current value is decreased under the influence only of the tension. The reason is that the superconducting wire is damaged by the tension larger than 500 g/mm$^2$. It follows from the results of the experiments shown in TABLE 3 that the tension applied to the superconducting wire 70 may preferably set to a level equal to or smaller than 500 g/mm$^2$.

Although the foregoing description has no information on diameter measurements of the carrier rollers 13a to 13d, preferable diameter measurements were evident from several experiments which were made with the carrier rollers having different diameters. The results of the experiments are shown in the following TABLE 4.

TABLE 4

| Diameter ot Roller | Variation of Critical Current Value (Assume that (Critical Current value) = 1 when Diameter = ∞) |
|---|---|
| ∞ (Rectilinear Shape) | 1 |
| 1000 | 1 |
| 800 | 1 |
| 500 | 1 |
| 300 | 1 |
| 200 | 0.9 |
| 100 | 0.7 |
| 50 | 0.4 |

As will be appreciated from TABLE 4, when the diameter of the roller is decreased to a level smaller than 300 mm, the critical current value is decreased from an allowable level. The reason is that the superconducting wire is bent by the carrier rollers each having a diameter smaller than 300 mm, and accordingly, damaged by the carrier rollers. It follows from the results of the experiments shown in TABLE 4 that the diameters of the carrier rollers 13a, 13b, 13c and 13d are preferably equal to or larger than 300 mm.

<Measuring Example 2>

Although the length of the superconducting wire 70 is 100 m in the measuring example 1, that in the measuring example 2 is assumed to be 200 m. The superconducting wire 70 is divided into 50 wire sections each having a length of 4 m. The measuring apparatus shown in FIG. 1 is operated to obtain a relationship between the applied electric currents I(1), I(2) . . . and I(100) and the summation voltages Vsum(1), Vsum(2) . . . and Vsum(100) in a manner similar to that described in the measuring example 1. In addition, an uncoiled superconducting wire having a length of 200 m is measured in the batch process to obtain another relationship between the applied electric current and the directly detected voltage each generated between one end and the other end of the uncoiled superconducting wire while the applied electric current is varied.

Figure 7:
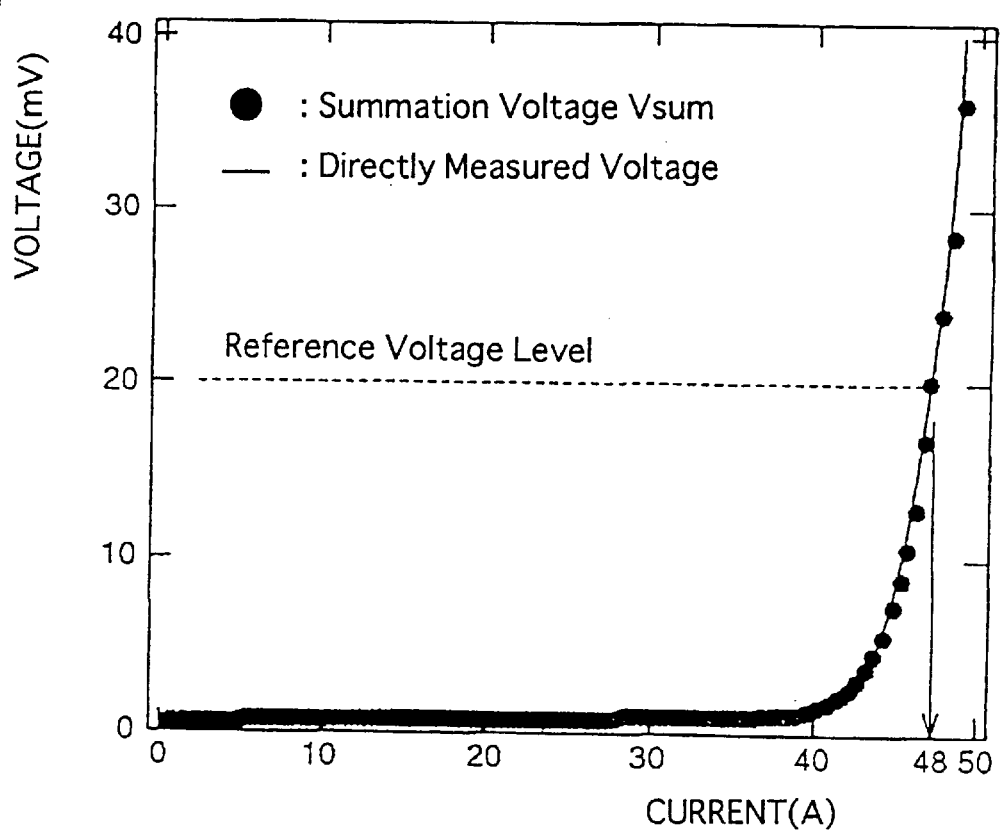
FIG. 7 is a graphical representation showing a relationship between the applied electric currents and the detected voltages in the whole superconducting wire having a length of 200 m.

FIG. 7 shows the relationship between the applied electric current and the generated voltage in the present measuring example by "•" and the another relationship between the applied electric current and the generated voltage in the comparable example by a solid line. As will be well understood from FIG. 7, the present measuring result shown by "•" corresponds substantially to the comparable measuring result shown by the solid line. This means that an accurate critical current value of the superconducting wire 70 can be calculated from the present measuring result. If a reference voltage for a superconducting wire having a length of 1 centimeter is assumed to be 1 $\mu$V, the reference voltage of the superconducting wire having a length of 200 meters is 20 mV. In the present measuring example 2 shown in FIG. 7, the reference voltage 20 mV of the superconducting wire 70 defines a critical current value of 48 A. While, in the comparable measuring result shown in FIG. 7, the reference voltage of the superconducting wire defines a critical electric current value of 47.8 A. It will be appreciated from the measuring examples 1 and 2 that the measuring result by the divisional process according to the present invention is substantially equal to that obtained by the batchwise process despite of the variation of the length of the superconducting wire 70.

<Measuring Example 3>

Figure 8:
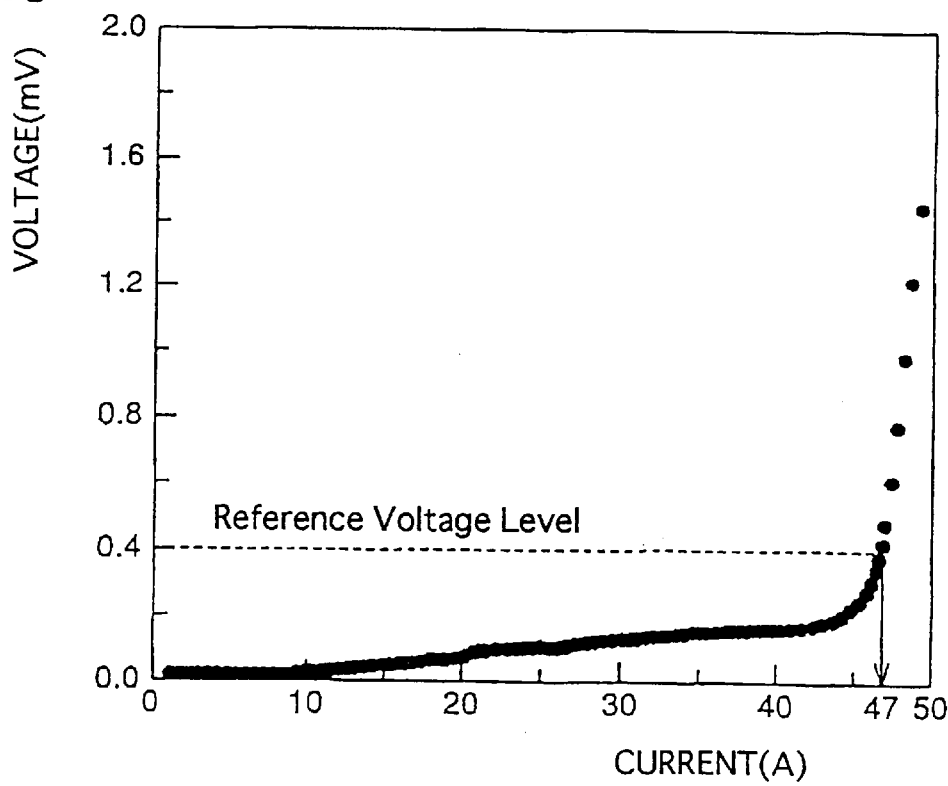
FIG. 8 is a graphical representation showing a relationship between the applied electric currents and the detected voltages in a first wire section of the superconducting wire having a length of 1000 m.

In the present example, the superconducting wire 70 having a length of 1000 m is prepared. The superconducting wire 70 is divided into 250 wire sections S(n) each having a length of 4 m. The measuring apparatus shown in FIG. 1 is operated to obtain a relationship between the applied electric currents I(1), I(2) . . . and I(100) and the generated voltages V(1), V42) . . . and V (100) in a first wire section S(1) of the superconducting wire 70. FIG. 8 shows the relationship between the applied electric current and the generated voltage in the present measuring example by "•". If a reference voltage for a superconducting wire having a length of 1 cm is assumed to be 1 $\mu$V, the reference voltage of the first wire section S(1) having a length of 4 m is 0.4 mV. In the present measuring example 3 shown in FIG. 8, the reference voltage 0.4 mV of the superconducting wire 70 defines a critical current value of 47 A.

Figure 9:
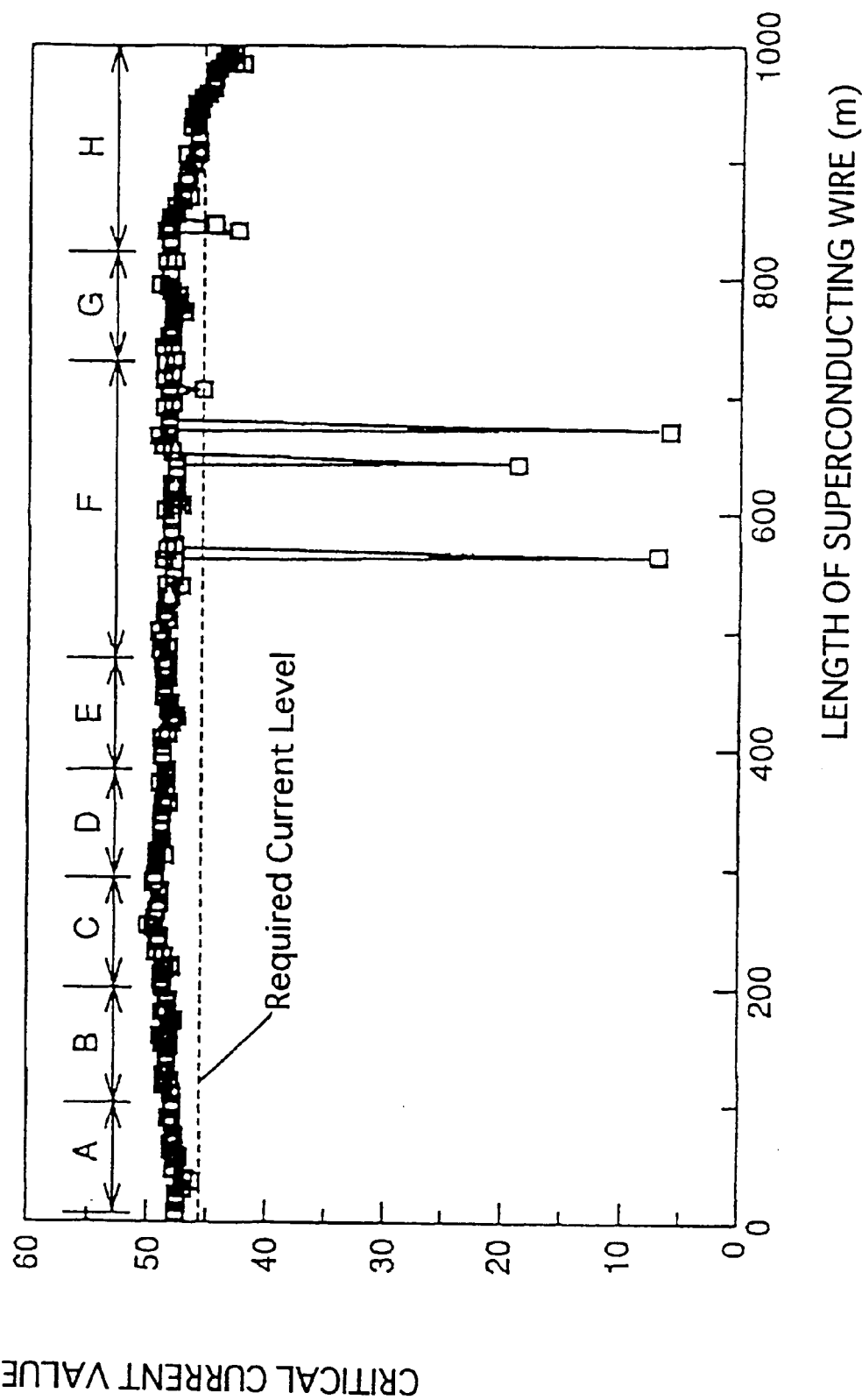
FIG. 9 is a graphical representation showing critical current values measured in 1st to 250th wire sections, respectively, of the superconducting wire having a length of 1000 m.

Furthermore, the measuring apparatus shown in FIG. 1 is operated to obtain current-voltage characteristics in the second wire section S(2) to the last wire section S(250) and calculate critical current values in the wire sections S(2) to S(250). FIG. 9 shows the variation of the critical current values in the wire sections S(1) through S(250) by " ". If a superconducting wire product is required to have, for example, a length of 100 m and a critical current value larger than 45 A, the superconducting wire portions designated by "A", "B", "C", "D", "E" and "G" in FIG. 9 may be selected and used as a product. In other words, FIG. 9 shows that the superconducting wire portions designated by "F" and "H" cannot be selected and used as a product. In the present measuring example, the variation of the critical current throughout the total superconducting wire can be detected and, as a consequence, the superior superconducting wire portions can be distinguished from the inferior superconducting wire sections with ease.

Figure 10:
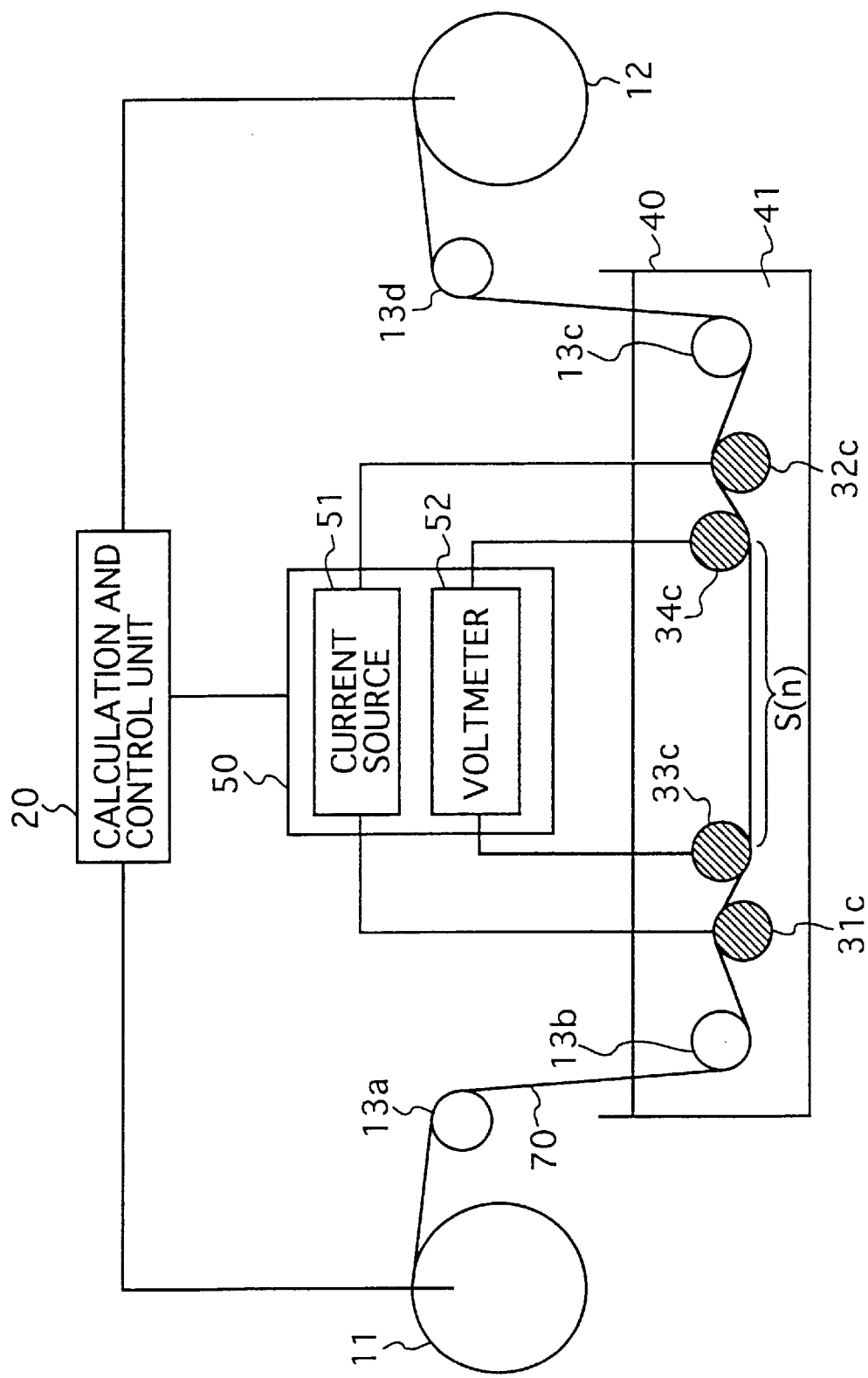
FIG. 10 is a schematic illustration showing a second embodiment of the measuring apparatus according to the present invention.

Referring to FIG. 10 of the drawings, a second embodiment of the measuring apparatus according to the present invention will be described hereinafter. The second embodiment of the measuring apparatus includes the same constitutional elements as the first embodiment of the measuring apparatus does. The constitutional elements of the second embodiment are respectively designated by the same reference numerals and symbols as the individual constitutional elements of the first embodiment are done, with the intention of omitting repeated description thereof.

The measuring apparatus is shown in FIG. 10 as comprising a pair of current electrode rollers 31c and 32c and a pair of voltage electrode rollers 33c and 34c in stead of the current electrode units 31 and 32 and the voltage electrode units 33 and 34. The current electrode rollers 31c and 32c and the voltage electrode rollers 33c and 34c are cylindrical and made of silver. Each of the current electrode rollers 31c and 32c and voltage electrode rollers 33c and 34c has a diameter of 10 cm and a length of 10 cm. The current electrode rollers 31c and 32c are rotatable and brought into contact with the superconducting wire 70. The current electrode rollers 31c and 32c serves not only as current electrodes for supplying an electric current to the superconducting wire 70 but also as carrier rollers for carrying the superconducting wire 70 from the feed roller 11 to the receive roller 12 in cooperation with the carrier rollers 13a, 13b, 13c and 13d. The voltage electrode rollers 33c and 34c are rotatable and brought into contact with the superconducting wire 70. The voltage electrode rollers 33c and 34c serve not only as voltage electrodes for picking up a voltage generate in the wire section S(n) but also as carrier rollers for carrying the superconducting wire 70 from the feed roller 11 to the receive roller 12 in cooperation with the carrier rollers 13a, 13b, 13c and 13d and the current electrode rollers 31c and 32c. The diameters of the carrier rollers 13a to 13d may be equal to or larger than 300 mm.

The many features and advantages of the invention are apparent from the detailed specification and thus it is intended by the appended claims to cover all such features and advantages of the invention which fall within the true spirit and scope thereof. Further, since numerous modifications and changes will readily occur to those skilled in the art, it is not desired to limit the invention to the exact construction and operation illustrated and described, and accordingly, all suitable modifications and equivalents may be resorted to, falling with the scope of the invention.

What is claimed is:

1. A method of measuring a critical current value of a superconducting wire divided into a plurality of wire sections longitudinally aligned, each of the wire sections being represented by S(n), n being $1 \leq n \leq N$, N being an integer larger than 1, and n being initially set to 1, comprising the steps of:

(a) determining a plurality of electric currents different from one another, each of the electric currents being represented by I(m), m being $1 \leq m \leq M$, and M being an integer larger than 1;

(b) setting m to 1;

(c) passing the electric current I(m) through the wire section S(n) of said superconducting wire;

(d) detecting a voltage generated in the wire section S(n) by the electric current I(m);

(e) replacing m with m+1 after said step (d)

(f) repeating said steps (c) to (e) until m is equal to M;

(g) replacing n with n+1 after said step (f)

(h) repeating said steps (b)–(g) until n is equal to N, thereby obtaining N×M voltages;

(i) setting m to 1 after said step (h);

(j) summing up the N voltages generated by the same electric current I(m) to obtain a summation voltage represented by Vsum(m);

(k) replacing m with m+1 after said step (j);

(l) repeating said steps (j) and (k) until m is equal to M, thereby obtaining M summation voltages Vsum(m); and (m) calculating the critical current value of said superconducting wire on the basis of a reference voltage and a relationship between the summation voltages Vsum (m) and the electric currents I(m), said reference voltage being predetermined depending upon the length of said superconducting wire.

2. A method as set forth in claim 1, in which said step (m) comprises the steps of:

(m1) drawing a characteristic curve representative of the relationship between the summation voltages and the electric currents in a current-voltage coordinate system; and (m2) obtaining, as the critical current value, an electric current defining a point on said curve in cooperation with said reference voltage.

3. A method as set forth in claim 1, in which said step (m) comprises the steps of:

(m1) selecting, from among said summation voltages, adjoining two summation voltages between which said reference voltage intervenes;

(m2) drawing, in a current-voltage coordinate system, a rectilinear segment connecting two points which are respectively defined by the selected two summation voltages and two electric currents causing the selected two summation voltages; and (m3) obtaining, as the critical current value, an electric current defining a point on said rectilinear segment in cooperation with said reference voltage.

4. A method of measuring local critical current values of a superconducting wire divided into a plurality of wire sections longitudinally aligned, each of the local critical current values being indicative of a critical current value of each of the wire sections of said superconducting wire, each of the wire sections being represented by S(n), n being $1 \leq n \leq N$, N being an integer larger than 1, and n being initially set to 1, comprising the steps of;

(a) determining a plurality of electric currents different from one another, each of the electric currents being represented by I(m), m being $1 \leq m \leq M$, and M being an integer larger than 1;

(b) setting m to 1;

(c) passing the electric current I(m) through the wire section S(n) of said superconducting wire;

(d) detecting a voltage generated in the wire section S(n) by the electric current I(m);

(e) replacing m with m+1 after said step (d);

(f) repeating said steps (c) to (e) until m is equal to M;

(g) replacing n with n+1 after said step (f);

(h) repeating said steps (b)–(g) until n is equal to N, thereby obtaining N×M voltages represented by V(n, m);

(i) setting n to 1 after said step (h);

(j) calculating the local critical current value on the basis of a reference voltage and a relationship between the voltages V(n,1) to V(n,M) in the wire section S(n) and the electric currents I(1) to I(M), the reference voltage being predetermined depending upon the length of the wire section S(n)

(k) replacing n with n+1 after said step (j);

(l) repeating said steps (j) and (k) until n is equal to N, thereby obtaining all the local critical current values of said superconducting wire.

5. A method as set forth in claim 4, in which said step (j) comprises the steps of:
- (j1) drawing a characteristic curve representative of the relationship between the voltages and the electric currents of the wire section S(n) in a current-voltage coordinate system; and
- (j2) obtaining, as the local critical current value, an electric current defining a point on said curve in cooperation with the reference voltage.

6. A method as set forth in claim 4, in which said step (j) comprises the steps of:
- (j1) selecting, from among said voltages, adjoining two voltages between which the reference voltage intervenes;
- (j2) drawing, in a current-voltage coordinate system, a rectilinear segment connecting two points which are respectively defined by the selected two voltages and two electric currents causing the selected two voltages; and
- (j3) obtaining, as the local critical current value, an electric current defining a point on said rectilinear segment in cooperation with the reference voltage.

7. An apparatus for measuring a critical current value of a superconducting wire, the superconducting wire being divided into a plurality of wire sections longitudinally aligned, comprising:
- conveying means for conveying said superconducting wire from a first location to a second location;
- cooling means for cooling one of the wire sections positioned between said first location and said second location;
- current applying means for applying an electric current to the wire section cooled by said cooling means;
- current varying means for varying the electric current applied by said current applying means, thereby applying different electric currents to the wire section;
- voltage detecting means for detecting voltages each generated in the wire section by the electric current each time the electric current is varied by said current varying means; and
- calculating means for calculating the critical current value on the basis of the electric currents applied to the wire section and the voltages detected by said voltage detecting means.

8. An apparatus as set forth in claim 7, in which said current applying means comprises:
- a current source for generating the electric current; and
- a pair of electrodes connected to said current source and detachably attached to said superconducting wire for passing the electric current throughout the wire section cooled by said cooling means.

9. An apparatus as set forth in claim 8, in which each of the electrodes of said current applying means includes a pair of electrode pieces facing to each other and allowing said superconducting wire to be sandwiched therebetween, and said current applying means further comprising:
- a pair of support members each movably supporting one of the electrode pieces of each electrode;
- a pair of elastic members each intervening between each support member and said one of the electrode pieces of each electrode; and
- movement means for moving said support members to press said one of the electrode pieces of each pair of electrodes on the other of the electrode pieces of each pair of electrodes and release said one of the electrode pieces of each pair of electrodes from the other of the electrode pieces of each pair of electrodes.

10. An apparatus as set forth in claim 8, in which the electrodes of said current applying means are made of noble metal.

11. An apparatus as set forth in claim 8, in which each of the electrodes of said current applying means is in the shape of a roller, the electrodes of said current applying means being rotated as said superconducting wire is conveyed by said conveying means.

12. An apparatus as set forth in claim 7, in which said voltage detecting means comprises:
- a pair of electrodes, one of the electrodes being detachably attached to one end of the wire section cooled by said cooling means, and the other of the electrodes being detachably attached to the other end of the wire section cooled by said cooling means; and
- a voltmeter connected to the electrodes for picking up the voltage generated in the wire section.

13. An apparatus as set forth in claim 12, in which each of the electrodes of said voltage detecting means includes a pair of electrode pieces facing to each other and allowing said superconducting wire to be sandwiched therebetween, and said voltage detecting means further comprising:
- a pair of support members each movably supporting one of the electrode pieces of each electrode;
- a pair of elastic members each intervening between each support member and said one of the electrode pieces of each electrode; and
- movement means for moving said support members to press said one of the electrode pieces of each pair of electrodes on the other of the electrode pieces of each pair of electrodes and release said one of the electrode pieces of each pair of electrodes from the other of the electrode pieces of each pair of electrodes.

14. An apparatus as set forth in claim 12, in which the electrodes of said voltage detecting means are made of noble metal.

15. An apparatus as set forth in claim 12, in which each of the electrodes of said voltage detecting means is in the shape of a roller, the electrodes of said voltage detecting means being rotated as said superconducting wire is conveyed by said conveying means.

16. An apparatus as set forth in claim 7, in which said conveying means applies a tension equal to or smaller than 500 g/mm$^2$ to said superconducting wire during conveying said superconducting wire.

17. An apparatus as set forth in claim 7, in which said conveying means comprises at least one roller brought into contact with said superconducting wire and changing the advance direction of said superconducting wire, the roller having a diameter equal to or larger than 300 mm.

* * * * *